(12) United States Patent
Embleton et al.

(10) Patent No.: US 12,449,213 B2
(45) Date of Patent: Oct. 21, 2025

(54) SYSTEMS AND METHODS FOR EMPLOYING FOR FORMING AND PATTERNING FLEXIBLE MATERIAL

(71) Applicant: Dell Products L.P., Round Rock, TX (US)

(72) Inventors: Steven Embleton, Austin, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 1492 days.

(21) Appl. No.: 16/921,347

(22) Filed: Jul. 6, 2020

(65) Prior Publication Data

US 2022/0003511 A1   Jan. 6, 2022

(51) Int. Cl.
*F28F 21/02*    (2006.01)
*B32B 3/30*     (2006.01)
*B32B 37/00*    (2006.01)
*H05K 7/20*     (2006.01)

(52) U.S. Cl.
CPC ............... *F28F 21/02* (2013.01); *B32B 3/30* (2013.01); *B32B 37/0076* (2013.01); *H05K 7/20263* (2013.01); *H05K 7/20772* (2013.01); *H05K 7/20781* (2013.01); *H05K 7/20836* (2013.01); *B32B 2305/02* (2013.01); *B32B 2307/304* (2013.01); *F28F 2255/02* (2013.01); *Y10T 29/4935* (2015.01)

(58) Field of Classification Search
CPC . B32B 3/30; B32B 2305/02; B32B 2307/304; F28F 21/02; F28F 2255/02; H05K 3/284; H05K 7/20263; H05K 7/20454; H05K 2201/09872; H05K 2201/0323; H05K 2203/1366; G02B 15/02
See application file for complete search history.

(56) References Cited

U.S. PATENT DOCUMENTS

| | | | | |
|---|---|---|---|---|
| 10,631,413 | B1* | 4/2020 | Chao | H05K 1/0203 |
| 2009/0288819 | A1* | 11/2009 | Taherian | E21B 47/017 |
| | | | | 166/244.1 |
| 2014/0233197 | A1* | 8/2014 | Schwab | H05K 5/03 |
| | | | | 361/752 |
| 2019/0104645 | A1* | 4/2019 | Paseman | G06F 1/203 |

* cited by examiner

*Primary Examiner* — Catherine A. Simone
(74) *Attorney, Agent, or Firm* — Jackson Walker L.L.P.

(57) ABSTRACT

A member may include a flexible material with thickness significantly smaller than that of other dimensions of the flexible material and at least one localized structure patterned within the flexible material, the at least one localized structure having a negative Poisson's ratio, such that when the member is mechanically coupled to a second structure using mechanical stress, the member conforms to features of the second structure.

18 Claims, 9 Drawing Sheets

SYSTEMS AND METHODS FOR EMPLOYING FOR FORMING AND PATTERNING FLEXIBLE MATERIAL

TECHNICAL FIELD

The present disclosure relates in general to information handling systems, and more particularly to forming and patterning flexible material, including flexible graphite used as heat-rejecting media in cooling of information handling system components.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

Employing liquid cooling in information handling systems, particularly servers, is challenging. The liquid flow required may necessitate large-diameter tubes with little room for routing such tubes. Thermal coupling to information handling resources may also be difficult, often requiring thick and rigid copper components.

Existing servers may include a rigid fluid delivery system which often requires 30 to 60 minutes to change a processor. Further, current memory cooling solutions employ a liquid tube through the memory components which requires increased memory module pitch, thus decreasing density.

SUMMARY

In accordance with the teachings of the present disclosure, the disadvantages and problems associated with traditional approaches to cooling information handling system components may be substantially reduced or eliminated.

In accordance with embodiments of the present disclosure, a member may include a flexible material with thickness significantly smaller than that of other dimensions of the flexible material and at least one localized structure patterned within the flexible material, the at least one localized structure having a negative Poisson's ratio, such that when the member is mechanically coupled to a second structure using mechanical stress, the member conforms to features of the second structure.

In accordance with these and other embodiments of the present disclosure, a system may include a component and heat-rejecting media mechanically and thermally coupled to the component and comprising a flexible material with thickness significantly smaller than that of other dimensions of the flexible material and at least one localized structure patterned within the flexible material, the at least one localized structure having a negative Poisson's ratio, such that when the heat-rejecting media is mechanically coupled to the component using mechanical stress, the heat-rejecting media conforms to features of the component.

In accordance with these and other embodiments of the present disclosure, a method may include patterning at least one localized structure within a flexible material having thickness significantly smaller than that of other dimensions of the flexible material, the at least one localized structure having a negative Poisson's ratio, such that when the member is mechanically coupled to a second structure using mechanical stress, the member conforms to features of the second structure.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 9B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
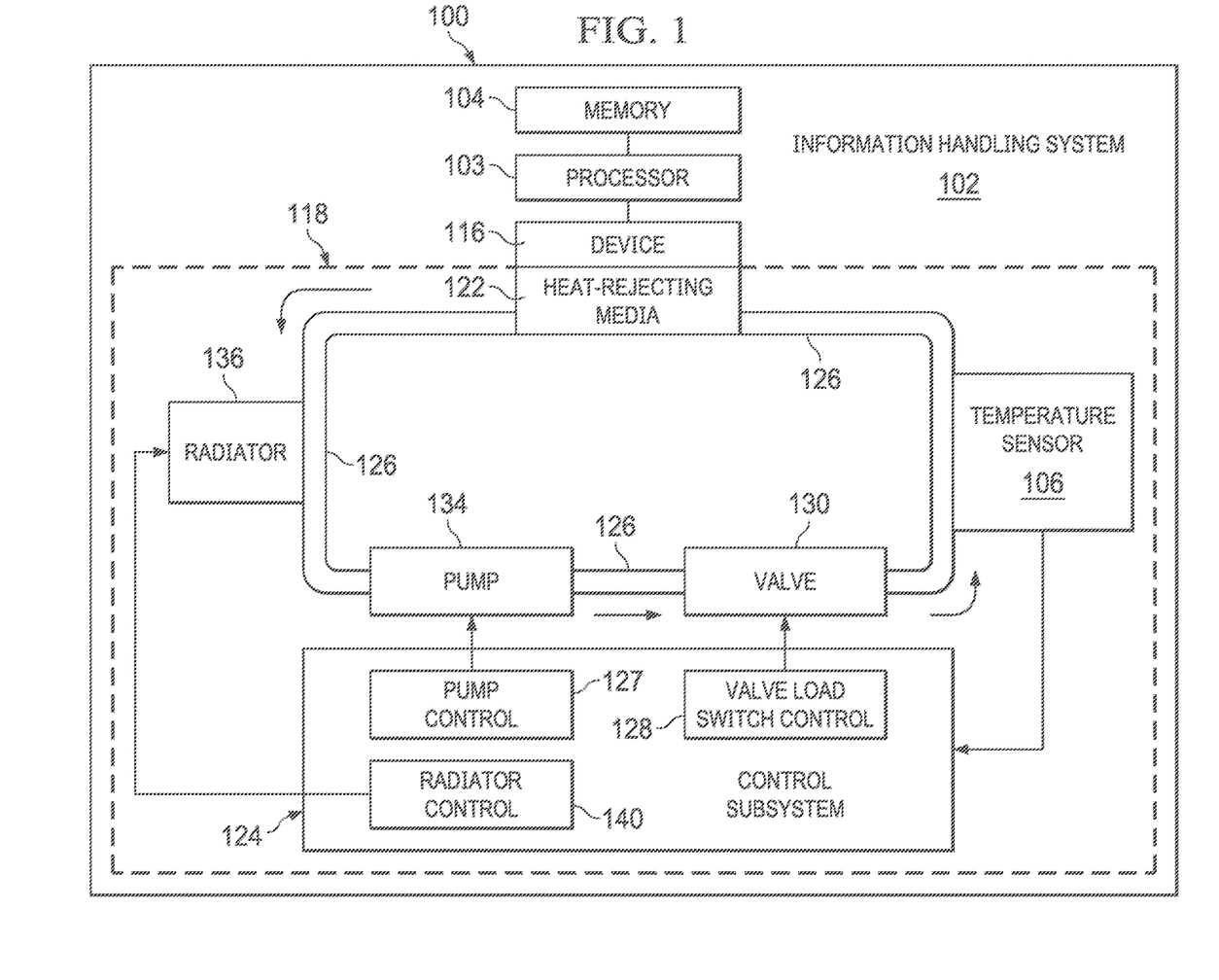
FIG. 1 illustrates a block diagram of an example information handling system, in accordance with embodiments of the present disclosure.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a device 116, and a liquid thermal control system 118.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Device 116 may comprise any component information handling system of information handling system 102, including without limitation processors, buses, memories, I/O devices and/or interfaces, storage resources, network interfaces, motherboards, integrated circuit packages; electro-mechanical devices, displays, and power supplies.

As shown in FIG. 1, liquid thermal control system 118 may include a temperature sensor 106, a control subsystem 124, heat-rejecting media 122, pump 134, radiator 136, valve 130, fluidic conduits 126, and radiator control 140.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102. Although FIG. 1 shows temperature sensor 106 in thermal communication with fluidic conduits 126 in order to determine a temperature of fluid therein, it is understood that temperature sensor 106 may appear in any suitable location within information handling system 102.

Control subsystem 124 may be communicatively coupled to temperature sensor 106, and may include any system, device, or apparatus (e.g., a processor, controller, etc.) configured to control components of liquid thermal control system 118 for increasing or decreasing a temperature of one or more information handling resources of information handling system 102. For example, control subsystem 124 may be configured to control pump 134, valve 130, and/or radiator 136 based on thermal data sensed by temperature sensor 106, so as to maintain a safe operating temperature for one or more information handling resources. Accordingly, control subsystem 124 may include a pump control subsystem 127 for controlling operation of pump 134 (e.g., a pressure applied to coolant fluid in fluidic conduits 126 for moving such fluid through fluidic conduits 126), a valve load switch control subsystem 128 for controlling operation of valve 130 (e.g., opening or closing valve 130, controlling an aperture of valve 130, etc.), and a radiator control subsystem 140 for controlling operation of radiator 136 (e.g., enabling or disabling radiator 136, etc.).

Pump 134 may be fluidically coupled to one or more fluidic conduits 126 and may comprise any mechanical or electro-mechanical system, apparatus, or device operable to produce a flow of fluid (e.g., fluid in one or more conduits 126). For example, pump 134 may produce fluid flow by applying a pressure to fluid in fluidic conduits 126. As described above, operation of pump 134 may be controlled by pump control subsystem 127 which may control electro-mechanical components of pump 134 in order to produce a desired rate of coolant flow.

Radiator 136 may include any device, system or apparatus configured to transfer thermal energy from one medium (e.g., fluid within a fluidic conduit 126) to another (e.g., air external to chassis 100) for the purpose of cooling and heating. In some embodiments, radiator 136 may include fluidic channels and/or conduits in at least a portion of radiator 136. Such fluidic channels and/or conduits may be fluidically coupled to one or more of fluidic conduits 126 and pump 134. As described above, operation of radiator 136 may be controlled by radiator control subsystem 140 which may control components of radiator 136 in order to produce a desired rate of heat transfer from the liquid within fluidic conduits 126.

Valve 130 may include any device, system or apparatus that regulates, directs, and/or controls the flow of a fluid (e.g., a coolant liquid in fluidic conduits 126) by opening, closing, or partially obstructing one or more passageways. When valve 130 is open, coolant liquid may flow in a direction from higher pressure to lower pressure. As described above, the operation of valve 130 (e.g., opening and closing, size of an aperture of valve 130) may be controlled by valve load switch control subsystem 128.

In operation, pump 134 may induce a flow of liquid (e.g., water, ethylene glycol, propylene glycol, or other coolant) through various fluidic conduits 126 of information handling system 102, valve 130 and/or radiator 136. As fluid passes by heat-rejecting media 122 in a fluidic conduit 126 proximate to device 116, heat may be transferred from device 116 to heat-rejecting media 122 and from heat-rejecting media 122 to the liquid in fluidic conduit 126. As such heated liquid flows by radiator 136, heat from the liquid may be transferred from the liquid to air ambient to chassis 100, thus cooling the liquid.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, heat fin, heat bridge, etc.) such that heat generated by the information handling resource is transferred from the information handling resource. As described in greater detail below, in some embodiments, heat-rejecting media 122 may comprise a heat spreader, heat fin, or heat bridge comprising flexible graphite shaped in a desired manner, or any material having similar properties to flexible graphite, including a pliability/flexibility at room temperature and a thermal conductivity at least three times that of copper. Further as described in greater detail below, in some embodiments, heat-rejecting media 122 may comprise a heat-pipe comprising flexible graphite shaped in a desired manner. In some embodiments, graphite comprising heat-rejecting media 122 may be anisotropic, with a thermal conductivity three times that of copper along two axis of the graphite, but with poor thermal conductivity along its third axis (e.g., thickness).

In addition to processor 103, memory 104, temperature sensor 106, device 116, and liquid thermal control system 118, information handling system 102 may include one or more other information handling resources. In addition, for the sake of clarity and exposition of the present disclosure, FIG. 1 depicts only one device 116. In embodiments of the present disclosure, information handling system 102 may include any number of devices 116. Furthermore, for the sake of clarity and exposition of the present disclosure, FIG. 1 depicts device 116 including a liquid thermal control system 118 for cooling of device 116. However, in some embodiments, approaches similar or identical to those used to cool device 116 as described herein may be employed to provide cooling of processor 103, memory 104, and/or any other information handling resource of information handling system 102.

Figure 2A:
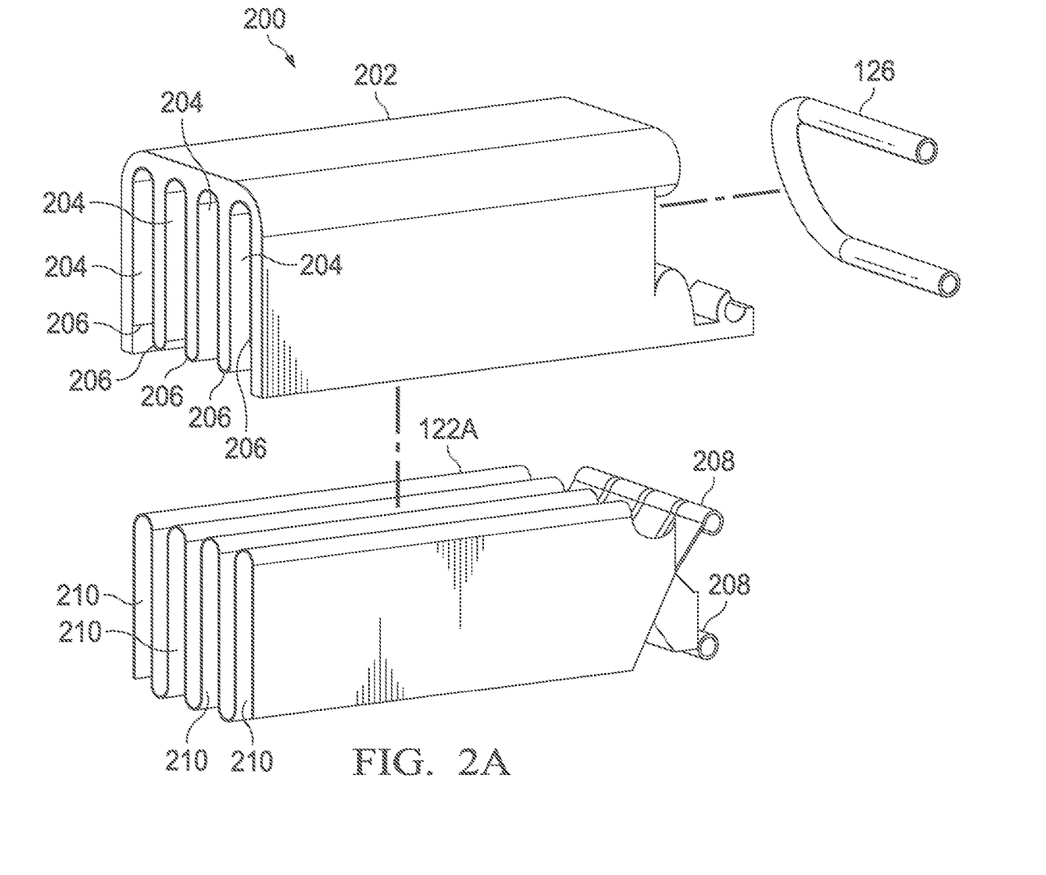
FIG. 2A illustrates an exploded isometric view of an example liquid cooling assembly, in accordance with embodiments of the present disclosure.
Figure 2B:
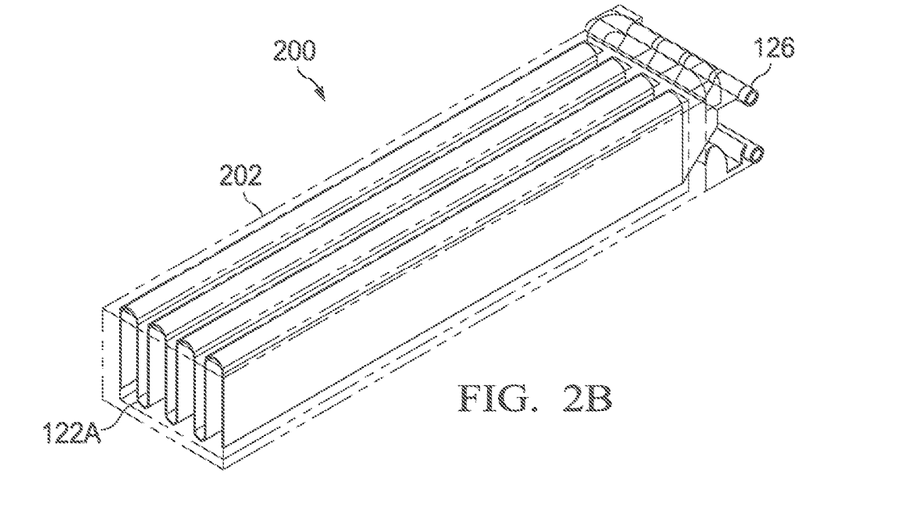
FIG. 2B illustrates an assembled isometric view of the example liquid cooling assembly depicted in FIG. 2A, in accordance with embodiments of the present disclosure.

FIG. 2A illustrates an exploded isometric view of an example liquid cooling assembly 200, in accordance with embodiments of the present disclosure. FIG. 2B illustrates an assembled isometric view of example liquid cooling assembly 200, in accordance with embodiments of the present disclosure. As shown in FIGS. 2A and 2B, liquid cooling assembly 200 may include a carrier 202, heat-rejecting media 122A, and a portion of fluidic conduit 126. Carrier 202 may comprise any suitable material, and as shown in FIGS. 2A and 2B, may include a plurality of U-shaped channels 204, each U-shaped channel 204 having opposing sidewalls lined with a compliant material 206.

Heat-rejecting media 122A may comprise flexible graphite or another material having flexibility and similar thermal conductivity properties (e.g., at least three times thermal conductivity of copper) to that of flexible graphite. In some embodiments, heat-rejecting media 122A depicted in FIGS. 2A and 2B may be used to implement heat-rejecting media 122 depicted in FIG. 1. As shown in FIG. 2A, heat-rejecting media 122A may include features 208 for receiving fluidic conduit 126, which thus may thermally couple heat-rejecting media 122A to fluidic conduit 126. Also, heat-rejecting media 122A may include a plurality of U-shaped channels 210, such that when assembled into liquid cooling assembly 200, U-shaped channels 210 of heat-rejecting media 122A may nest within respective U-shaped channels 204 of carrier 202.

Figure 3A:
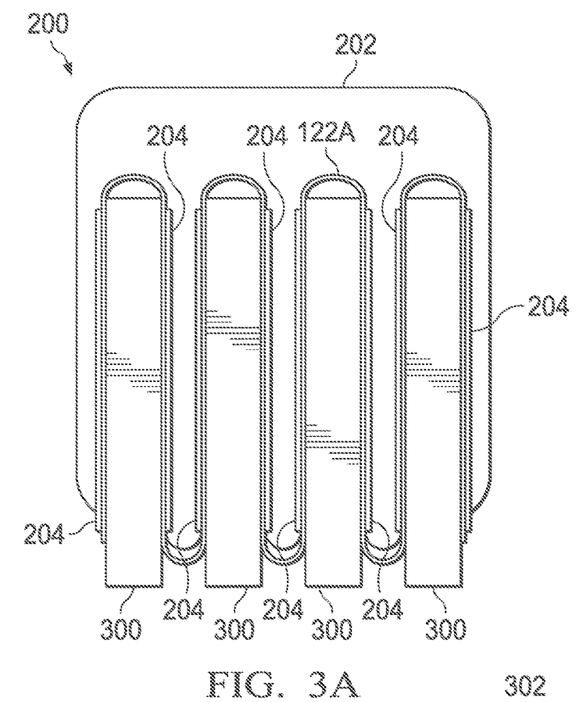
FIG. 3A illustrates a cross-sectional side view of an example liquid cooling assembly thermally coupled to adjacent memory modules, in accordance with embodiments of the present disclosure.

In use, liquid cooling assembly 200 may press fit upon a plurality of adjacent modules 300 (e.g., dual-inline memory modules or "DIMMs"), as shown in FIG. 3A, such that compliant material 206 may apply force upon heat-rejecting media 122A in order to thermally couple heat-rejecting media 122A to modules 300. In particular, the flexible nature of heat-rejecting media 122A may allow heat-rejecting media 122A to, under the force of compliant material 206, flexibly conform its shape to that of the surfaces of modules 300, which may include memory chips and/or other structures, thus potentially maximizing thermal coupling between heat-rejecting media 122A and surfaces of modules 300. Accordingly, in operation, heat generated by modules 300 may be transferred from modules 300 to heat-rejecting media 122A, and from heat-rejecting media 122A to a cooling liquid within fluidic conduit 126, thus providing cooling to components (e.g., memory chips) of modules 300.

Figure 3B:
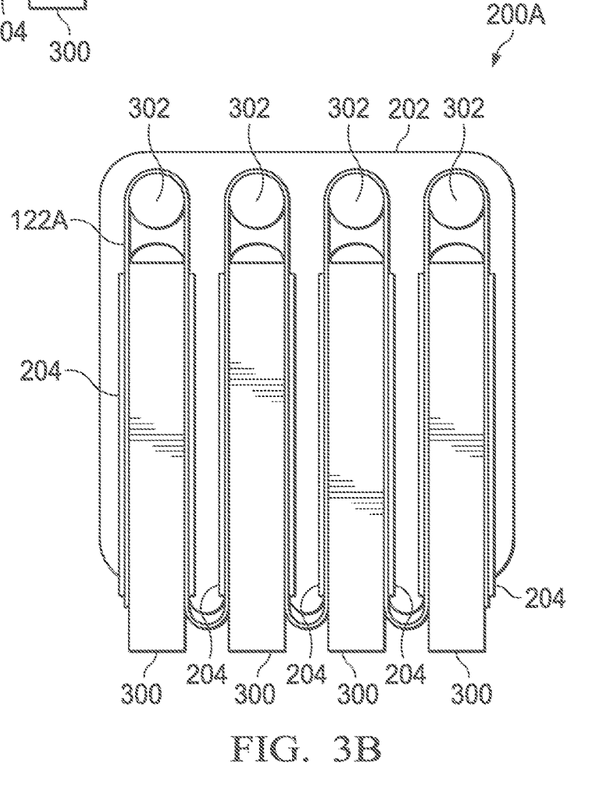
FIG. 3B illustrates a cross-sectional side view of another example liquid cooling assembly thermally coupled to adjacent memory modules, in accordance with embodiments of the present disclosure.

FIG. 3B illustrates a liquid cooling assembly 200A slightly modified from liquid cooling assembly 200 shown in FIGS. 2A and 2B. As shown in FIG. 3B, fluidic conduits 302, which may comprise or may fluidically couple to fluidic conduit 126, may run inline and in parallel with modules 300 when liquid cooling assembly 200A is engaged with modules 300, and carrier 202 may apply force to heat-rejecting media 122A, such that heat-rejecting media 122A maintains thermal coupling with both fluidic conduits 302 and modules 300, such that heat may transfer from memory 300 to heat-rejecting media 122A to cooling liquid within fluidic conduits 302, thus providing cooling to components (e.g., memory chips) of modules 300.

Figures 4, 5:
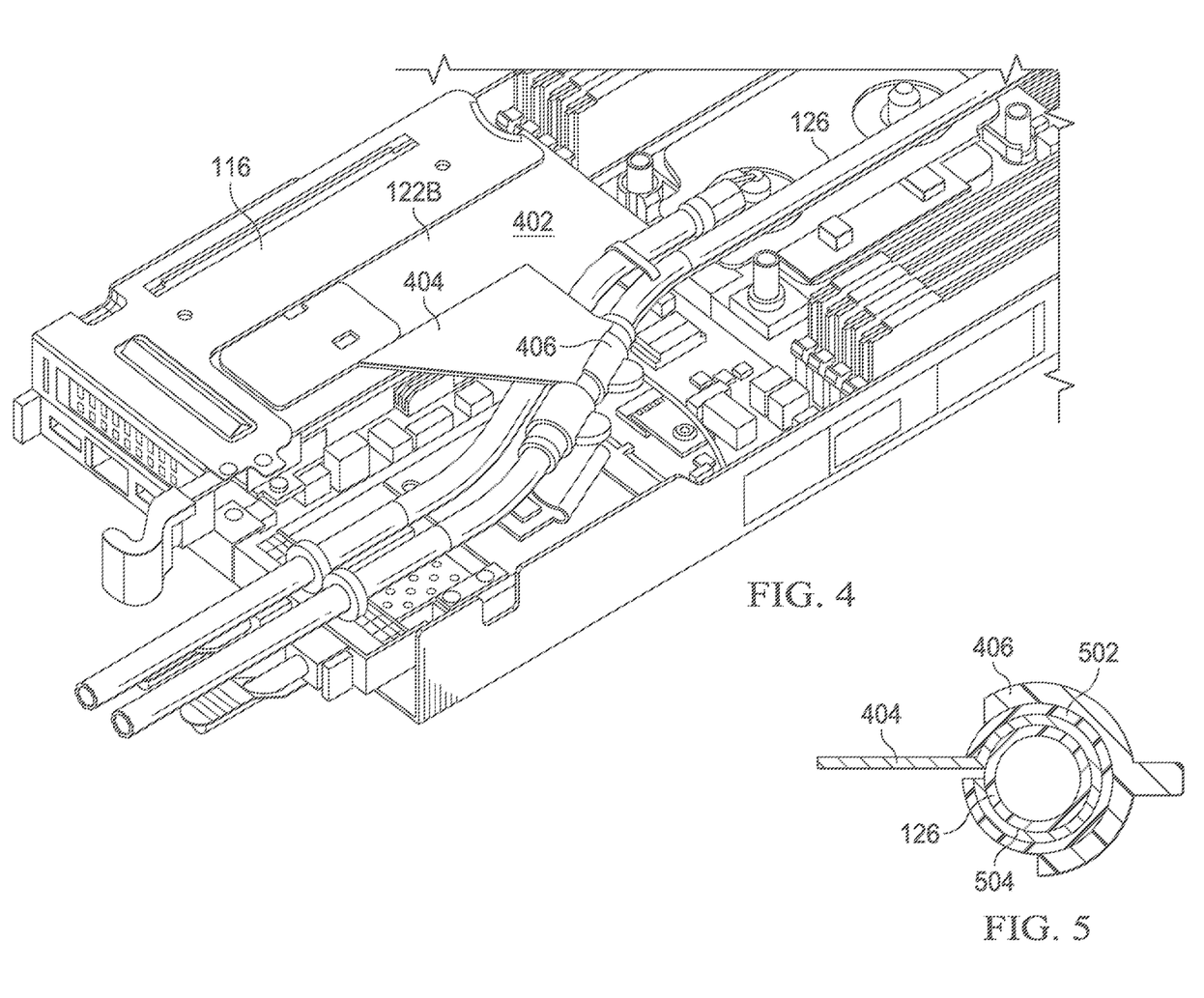
FIG. 4 illustrates an isometric view of selected components of an information handling system, including heat-rejecting media comprising a heat spreader portion and a heat bridge section thermally coupled between a device and a fluidic conduit of a liquid cooling system, in accordance with embodiments of the present disclosure.
FIG. 5 illustrates a cross-sectional side view of selected components of an information handling system, including a heat bridge section of heat-rejecting media thermally coupled to a fluidic conduit, in accordance with embodiments of the present disclosure.

FIG. 4 illustrates an isometric view of selected components of information handling system 102, including heat-rejecting media 122B comprising a heat spreader portion 402 and a heat bridge section 404 thermally coupled between device 116 and fluidic conduit 126, in accordance with embodiments of the present disclosure. As shown in FIG. 4, heat-rejecting media 122B may be arranged such that heat generated by device 116 may be transferred to fluidic conduit 126 via heat spreader portion 402, then to heat bridge section 404 of heat-rejecting media 122B. Heat spreader portion 402 may be mechanically and thermally coupled to device 116 in any suitable manner, including via a thermal interface material or other adhesive. As shown in FIG. 4, heat bridge section 404 may be mechanically and thermally coupled to fluidic conduit 126 via a clip 406 or other suitable fastener or securement.

FIG. 5 illustrates a cross-sectional side view of selected components of information handling system 102, including heat bridge section 404 of heat-rejecting media thermally coupled to fluidic conduit 126, in accordance with embodiments of the present disclosure. As shown in FIG. 5, heat bridge section 404 may terminate into a full or partial cylindrical shape termination 504 which may wrap around or otherwise maintain contact with fluidic conduit 126. Thermal insulation 502 may surround termination 504, thus providing thermal isolation between termination 504 and fluidic conduit 126 on one hand and an ambient environment on the other hand, thus potentially maximizing heat transfer from heat bridge section 404 to fluidic conduit 126. As further shown, clip 406 may secure termination 504 to fluidic conduit 126 (and may secure thermal insulation 502 to termination 504). Clip 406 may include an inherent spring force that maintains clip 406 in place, and in so doing, maintains physical contact between termination 504 and fluidic conduit 126, thus potentially maximizing heat transfer from heat bridge section 404 to fluidic conduit 126.

Figure 6A:
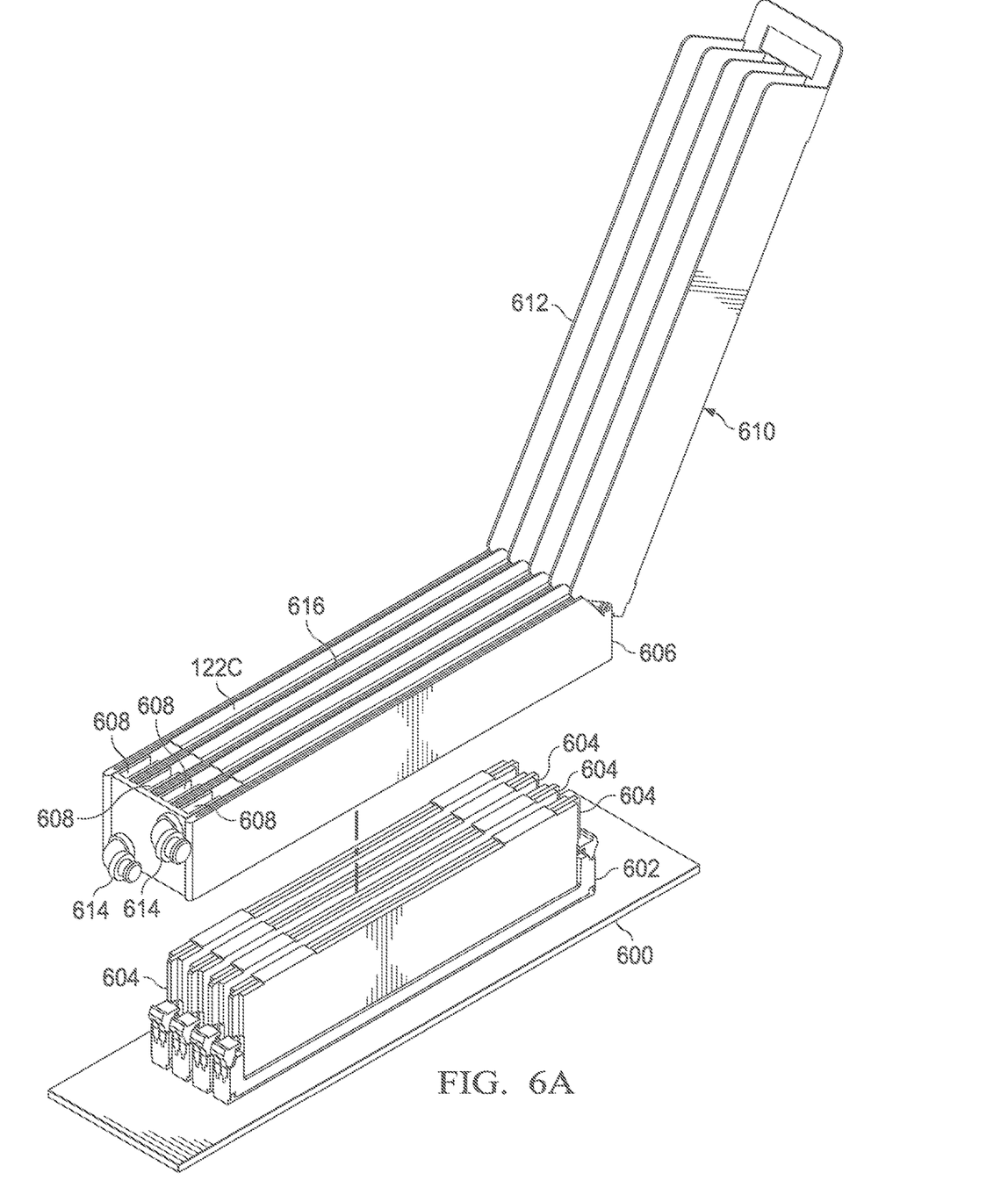
FIGS. 6A-6C illustrate an isometric view of an example liquid cooling assembly at various stages of installation, in accordance with embodiments of the present disclosure.
Figure 6B:
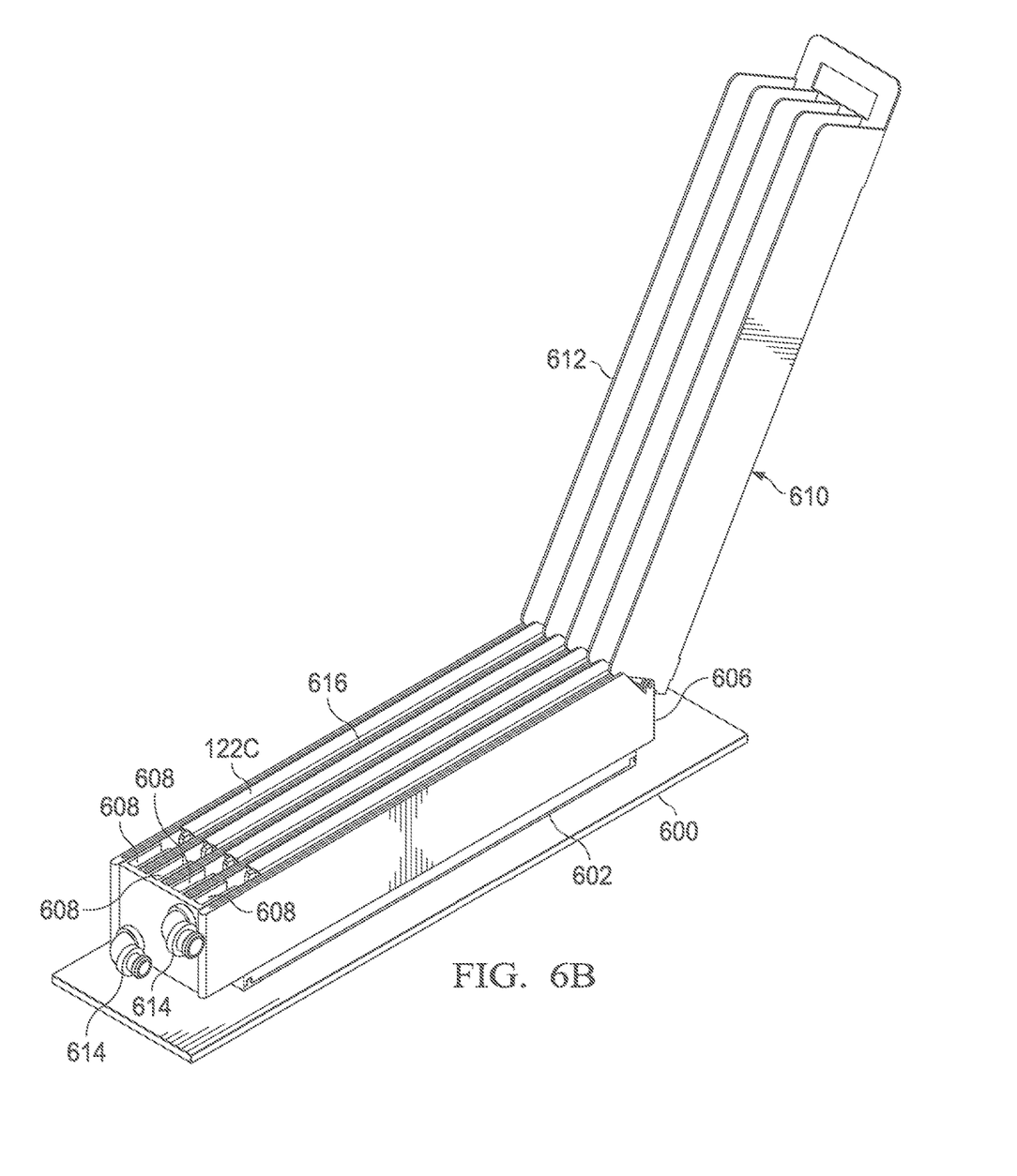
Figure 6C:
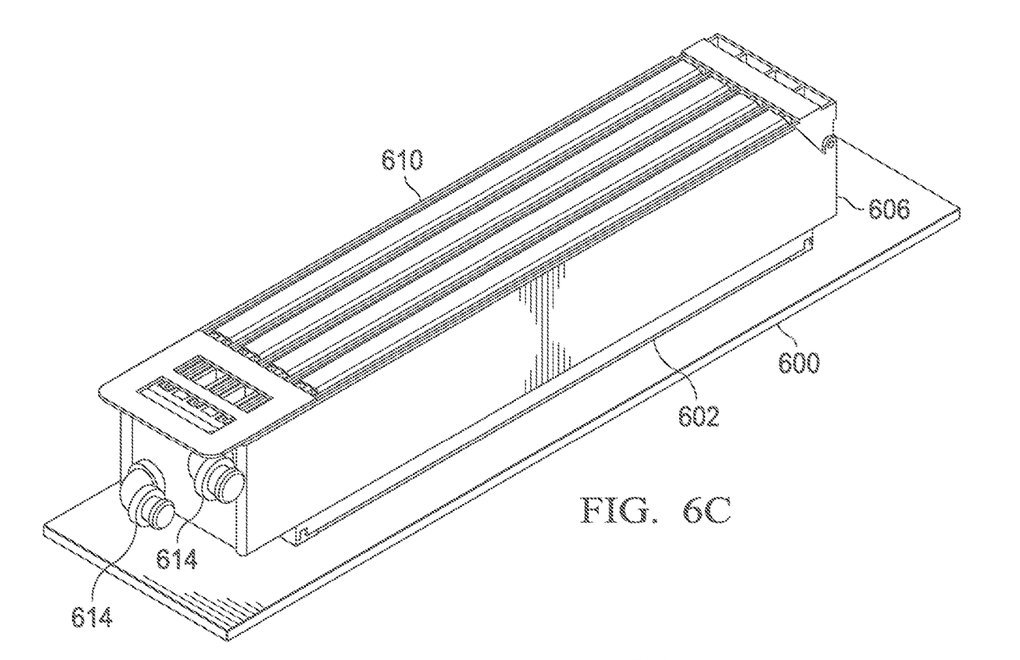

FIGS. 6A-6C illustrate an isometric view of an example liquid cooling assembly 606 at various stages of installation, in accordance with embodiments of the present disclosure. As shown in FIGS. 6A-6C, a backplane 600 (e.g., a motherboard or other printed circuit board) may include a plurality of adjacent receptacle connectors 602, each receptacle connector 602 configured to receive a module 604 (e.g., a memory module) to mechanically and electrically couple the module to such receptacle connector 602 and backplane 600. Liquid cooling assembly 606 may include a first portion 616 hingedly coupled to a second portion 610. First portion 616 may include fluid fittings 614 configured to fluidically couple to fluidic conduit 126, and fluid fittings 614 may in turn be fluidically coupled to fluidic conduits 608 integral to liquid cooling assembly 606. First portion 616 may also include heat-rejecting media 122C formed in a plurality of U-shaped channels, such that fluidic conduits 608 thermally couple to heat-rejecting media 122C within concavities of such U-shaped channels. Second portion 610 may include compliant material 612, which may also include a plurality of U-shaped channels corresponding to the U-shaped channels of heat-rejecting media 122C.

In order to engage liquid cooling assembly 606 to modules 604, liquid cooling assembly 606 may be positioned over modules 604 as shown in FIG. 6A, and lowered onto module 604 as shown in FIG. 6B, with each individual concavity of the U-shaped channels lowered onto a respective module 604, such that opposite parallel walls of each U-shaped channels come in physical contact with a respective surface (e.g., memory chips mounted to such surface) of a module 604. After liquid cooling assembly 606 has been lowered onto modules 604 as shown in FIG. 6B, a user may move second portion 610 from the open position shown in FIG. 6B to the closed position shown in FIG. 6C. When lowered into the closed position, compliant material 612 may apply force to heat-rejecting media 122C, maintaining thermal coupling between heat-rejecting media 122C and modules 606. In particular, the flexible nature of heat-rejecting media 122C may allow heat-rejecting media 122C to, under the force of compliant material 612, flexibly conform its shape to that of the surfaces of modules 604, which may include memory chips and/or other structures, thus potentially maximizing thermal coupling between heat-rejecting media 122C and surfaces of modules 604.

In some embodiments, a cross-sectional side view of liquid cooling assembly 606 engaged with modules 604 may appear similar to that depicted in FIG. 3C, described above.

Figure 7A:
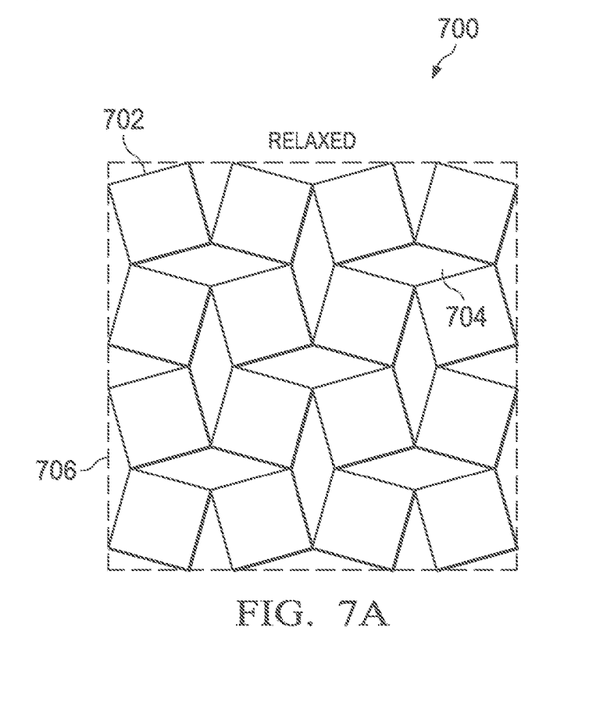
FIG. 7A illustrates an auxetic structure that may be formed in heat-rejecting media, in accordance with embodiments of the present disclosure.
Figure 7B:
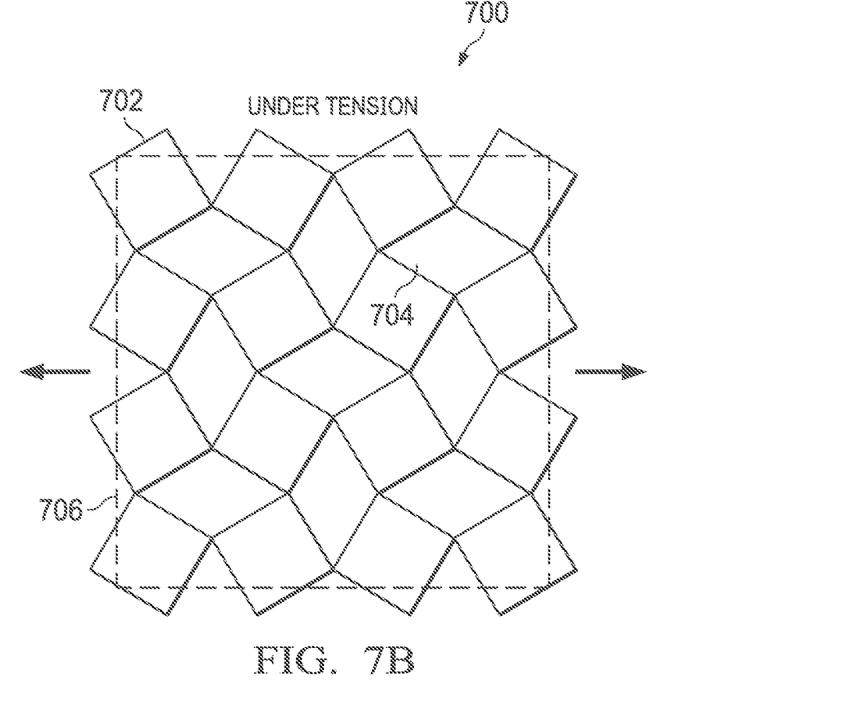
FIG. 7B illustrates the auxetic structure shown in FIG. 7A under pressure or tension, in accordance with embodiments of the present disclosure.

To enhance mechanical and thermal coupling of heat-rejecting media 122 to a heat-generating device 116, in some embodiments, heat-rejecting media 122 may include local mechanical structures formed therein to assist heat-rejecting media 122 to mechanically conform to a heat-generating device 116 to which it is coupled. For example, FIG. 7A illustrates an example auxetic structure 700 that may be formed in heat-rejecting media 122, in accordance with embodiments of the present disclosure. FIG. 7B illustrates auxetic structure 700 under pressure or tension, in accordance with embodiments of the present disclosure.

Generally speaking, an auxetic structure may be a mechanical structure that has a negative Poisson's ratio. When stretched, an auxetic structure may become thicker perpendicular to the applied stretching force. This phenomenon may occur due to a particular internal structure or pattern. To illustrate, FIG. 7A depicts auxetic structure 700 without any external force or tension applied. As shown in FIG. 7A, auxetic structure 700 may include a pattern of polygons 702 (e.g., squares) arranged with a pattern of polygonal voids 704 (e.g., non-square parallelograms) formed therein. Although FIG. 7A depicts a particular auxetic structure 700, other auxetic structures may be used in accordance with the present disclosure.

When a mechanical tension is applied to auxetic structure 700 (e.g., in the horizontal axis of FIGS. 7A and 7B), auxetic structure 700 may increase in dimension in an axis perpendicular to the applied tension (e.g., in the vertical axis of FIGS. 7A and 7B).

Figure 8:
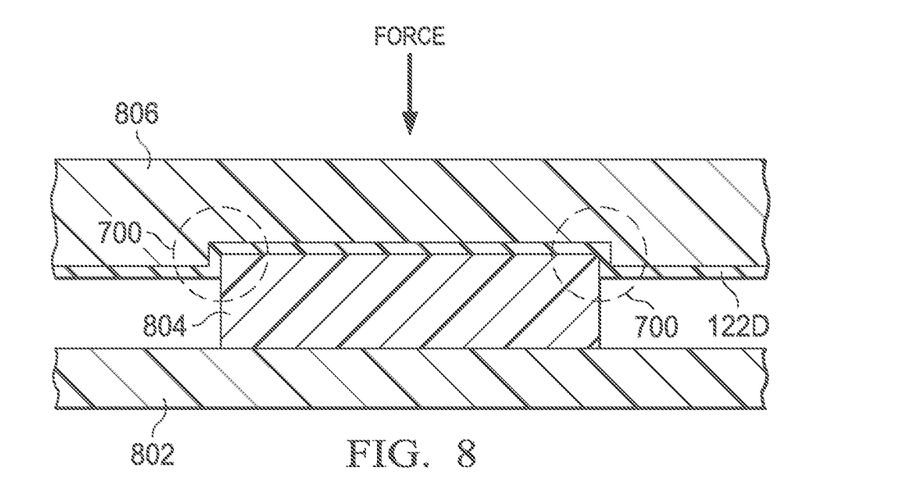
FIG. 8 illustrates example heat-rejecting media including auxetic structures wherein the heat-rejecting media thermally couples and mechanically conforms to a component, in accordance with embodiments of the present disclosure.

FIG. 8 illustrates example heat-rejecting media 122D including auxetic structures 700 wherein heat-rejecting media 122D thermally couples and mechanically conforms to a component 804 (e.g., a memory chip mounted to a module 802 in the form of a printed circuit board), in accordance with embodiments of the present disclosure. Heat-rejecting media 122D may include a thin flexible material (e.g., with a thickness significantly smaller than its other dimensions, so as to be practically two-dimensional in nature), such as a thin, flexible graphite, and auxetic structures 700 may be formed therein in any suitable manner, including as described in further detail below. According, as a force is applied to compliant material 806 mechanically coupled to heat-rejecting media 122D, auxetic structures 700 aligned with corners or other features of component 804 may conform a shape of heat-rejecting media 122D to component 804, thus potentially increasing physical contact and thermal coupling between component 804 and heat-rejecting media 122D.

Figure 9A:
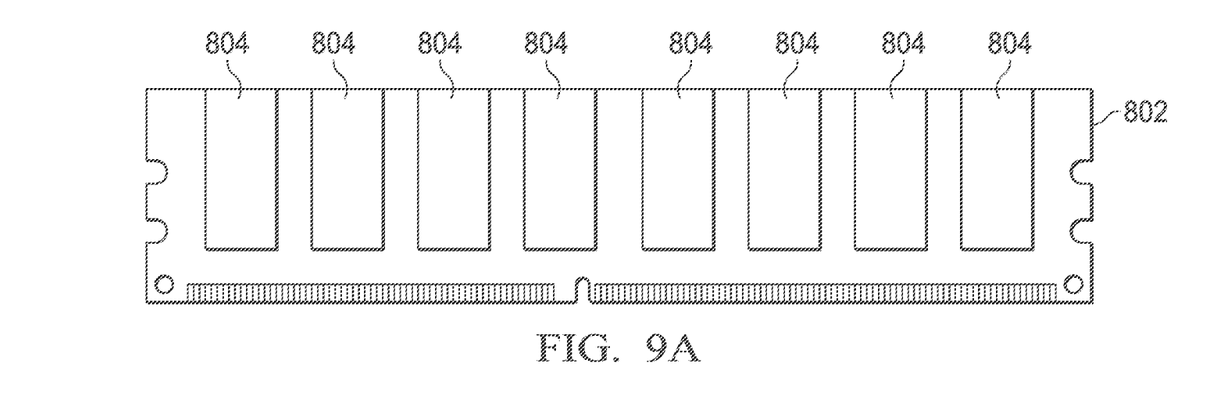
FIG. 9A illustrates an example module having components to which heat-rejecting media including auxetic structures may be thermally coupled, in accordance with embodiments of the present disclosure.
Figure 9B:
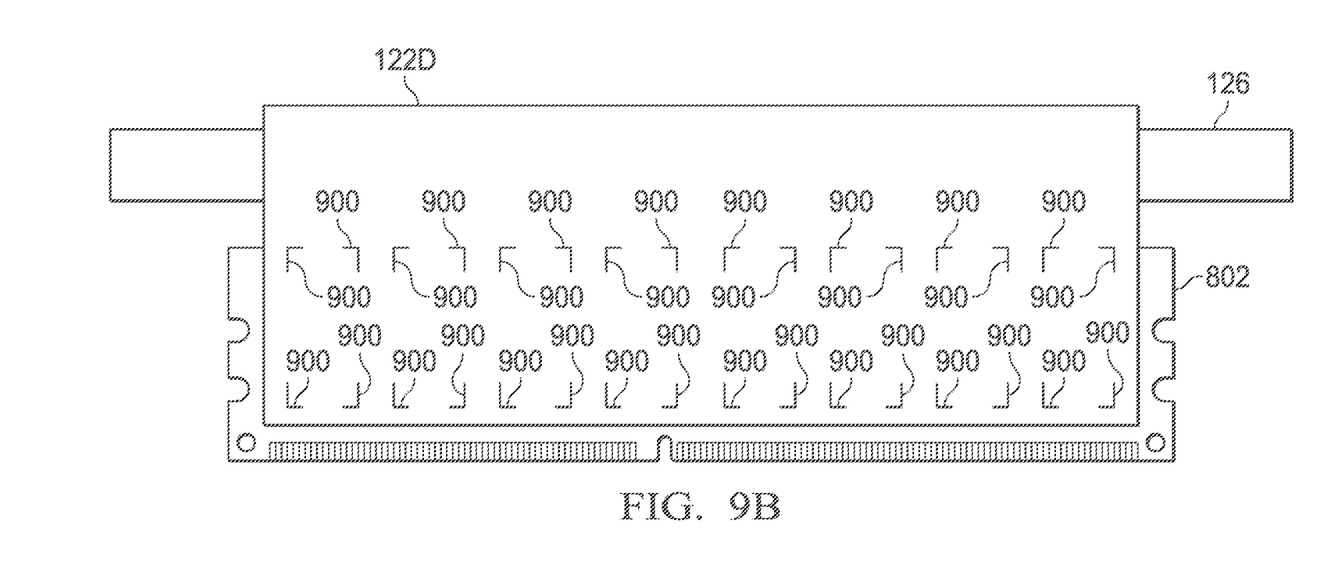
FIG. 9B illustrates example heat-rejecting media including auxetic structures that may be scored therein, in accordance with embodiments of the present disclosure.

To illustrate how auxetic structures 700 may be formed in heat-rejecting media 122D, FIG. 9A illustrates module 802 (e.g., memory module) having components 804 (e.g., memory chips) to which heat-rejecting media 122D including auxetic structures 700 may be thermally coupled, in accordance with embodiments of the present disclosure. FIG. 9B illustrates heat-rejecting media 122D (having fluidic conduit 126 thermally and mechanically coupled thereto) including illustration of locations 900 within heat-rejecting media which may be patterned (e.g., scored and/or cut) to form auxetic structures 700 (not explicitly shown in FIG. 9B), in accordance with embodiments of the present disclosure. Locations 900 may correspond to (e.g., may be matched to) locations of particular features (e.g., corners or edges) of components 804. In some embodiments, heat-rejecting media 122D may be scored without such scoring penetrating through heat-rejecting media 122D, while in the same or alternative embodiments, patterning may penetrate through heat-rejecting media 122D.

Although FIGS. 7A through 9B and the discussion thereof pertain to forming auxetic structures 700 in heat-rejecting media 122D comprising a flexible graphite material, it is understood that the teachings of the present disclosure may apply to forming auxetic structures in other material to enable such material to conform to a shape of another structure to which such material may be mechanically coupled.

In operation, auxetic structures 700 may first fail when mechanically stressed creating a localized area (e.g., an area under mechanical stress) having a negative Poisson's ratio, while an area of heat-rejecting media 122D not stressed may not fail. In other words, application of heat-rejecting media 122D including auxetic structures 700 to a non-uniform surface may mechanically stress heat-rejecting media 122D, which may cause localized failures at auxetic structures 700, allowing heat-rejecting media 122D to locally conform to shapes with large deviations and non-uniformities.

In some instances, relief features (e.g., patterned features which penetrate through heat-rejecting media 122D) may be formed within areas of high stress concentration (e.g., corresponding with corners of a component 804).

In these and other embodiments, use of auxetic structures 700 or other patterned features may be minimized in order to maximize the thermal conductivity of heat-rejecting media 122D.

In these and other embodiments, heat-rejecting media 122D may include alignment features patterned therein to bias heat-rejecting media 122D into a desired alignment with a component 804.

In these and other embodiments, use of auxetic structures 700 or other patterned features may be formed using one or more of die cutting, laser ablation, water jet, reel-to-reel manufacturing, and/or any other suitable technique.

Although particular arrangements are depicted and described above showing use of flexible graphite or a material with similar properties as heat-rejecting media, it is understood that other arrangements may be used in order to transfer heat from heat-generating components to cooling fluid within fluidic conduits of a liquid cooling system.

Although the foregoing contemplates using a clip or compliant material to maintain physical contact between heat-rejecting media 122 and a thermal source (e.g., an information handling resource) and a thermal sink (e.g., fluidic conduit), any other suitable system, device, or apparatus for supplying such force may be used, including a clamp, pressure from a compliant element, pressure applied by a secondary process, a latching force, a ramped insert, mechanism activated through a cam during motion, a bi-stable latching mechanism, traditional fasteners, bolts, clamps, etc.

In one or more embodiments of the present disclosure, heat-rejecting media 122 may include one or more features to improve serviceability of information handling resources. In one or more embodiments of the present disclosure, such one or more features may include compliant features that deform to secure heat-rejecting media 122 to and release heat-rejecting media 122 from a thermal source or thermal sink. In some of these embodiments, such compliant features may provide positive feedback (e.g., audible clicks) that such compliant features are properly installed. In these and other embodiments, such one or more features may allow heat-rejecting media 122 to rotate about a thermal sink or a thermal source without disconnecting or removing the compliant material from the heat-rejecting media 122.

In these and other embodiments, heat-rejecting media 122 may have continuous thermal coupling to or between one or more components. For example, in some embodiments, heat-rejecting media 122 may thermally communicate with one or more thermal sinks. As another example, heat-rejecting media 122 may be formed to ensure a face of heat-rejecting media 122 in contact with a thermal source is the same face of heat-rejecting media 122 in contact with a thermal sink. One or more deformations of heat-rejecting media 122 may be used to form a desired shape of heat-rejecting media 122, including folding, bending, and twisting. As a further example, a portion of heat-rejecting media 122 may be wrapped around a cylindrical thermal sink to maximize surface area between heat-rejecting media 122 and such thermal sink.

In some embodiments, heat-rejecting media 122 may include a "service loop" to improve serviceability and installation. For example, in some embodiments, heat-rejecting media 122 may have a length or shape to avoid other components.

Although not expressly described above, heat-rejecting media 122 may be incorporated into a hard drive carrier. For example, heat-rejecting media 122 may be in thermal contact with a hard drive when the hard drive is secured to the hard drive carrier. As another example, in some embodiments, installation of a hard drive carrier into an information handling system chassis may cause thermal contact of heat-rejecting media 122 to hard drives within the hard drive carrier. As a further example, in these and other embodiments, a hard drive carrier may provide structure to support heat-rejecting media 122 and provide mechanical pressure between heat-rejecting media 122 and other thermal components. In such embodiments, such structure may have compliant mechanisms to provide positive confirmation (e.g., audible clicks) when properly installed.

In these and other embodiments, heat-rejecting media 122 may be incorporated within an information handling system chassis (e.g., within hard drive bays, memory slots, etc.). Thus, instead of a carrier assembly including heat-rejecting media 122, heat-rejecting media 122 may be located within the chassis of an information handling system itself. For example, heat-rejecting media 122 may be incorporated on a component installed on a motherboard or backplane. As another example, heat-rejecting media 122 may be backed by a compliant layer, wherein installation of an information handling resource causes the compliant layer to move out of the way, and once the information handling resource is installed, the compliant layer provides a pressure on heat-rejecting media 122 against the information handling resource. As a further example, heat-rejecting media 122 may physically conform against the information handling resource using one of the mechanisms described above.

Among the advantages of heat-rejecting media 122 is that it may be used to thermally cool information handling resources (e.g., memory modules, hard drives, riser cards, etc.) while minimizing their pitch for maximum component density.

In addition, groups of components may be secured to heat-rejecting media 122 such that that they may be installed and/or uninstalled as a single component. For example, memory modules may be stacked to minimize pitch with a heat-rejecting media 122 in between adjacent memory modules, such that two or more memory modules may be installed or uninstalled at once.

In some embodiments, heat-rejecting media 122 may comprise multiple portions of heat-rejecting media 122 mechanically coupled together that may be conveniently coupled and decoupled from one another. Such mechanism may provide a thermal "quick disconnect" feature allowing an information handling resource to be serviced. In some embodiments, portions of heat-rejecting media 122 may be clamped together to provide a continuous thermal path. In such embodiments, installation of a component to be cooled may provide the clamping force.

The systems and methods described above may enable replacing a section of flexible tube with copper tube and securing heat-rejecting media 122 to the copper tube to provide a mechanism for cooling components on servers previously designed. In such instances, heat-rejecting media 122 may be secured and serviced via one or more mechanisms described above. In some embodiments, replacing small sections of a flexible tube may still allow the tube to maintain desired flexibility.

In some embodiments, heat-rejecting media 122 may be combined with a thermally isolating surface and/or thermal insulator to minimize unintentional radiated and conducted heat from heat-rejecting media 122. For example, such thermal insulator may be applied to thermal and/or mechanical connection points or user touch points for servicing. As another example, a thermal insulator may be applied across a substantial portion of heat-rejecting media 122 to minimize heat transferred into an information handling system chassis. As a further example, a thermal insulator may be applied across a substantial portion of heat-rejecting media 122 to prevent one information handling resource from warming another information handling resource.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A member comprising:
   a flexible material with thickness significantly smaller than that of other dimensions of the flexible material;
   at least one localized structure patterned within the flexible material prior to mechanically coupling the member to a second structure, the at least one localized structure having a negative Poisson's ratio such that the member is configured to conform to features of the second structure when the member is mechanically coupled to the second structure using mechanical stress; and
   a compliant material coupled to the flexible material in order to provide mechanical force to maintain physical contact between the flexible material and the second structure.

2. The member of claim 1, wherein the flexible material comprises a flexible graphite material.

3. The member of claim 1, wherein the flexible material is thermally conductive and the compliant material is thermally insulative.

4. The member of claim 1, wherein the at least one localized structure comprises patterning that does not penetrate through the flexible material.

5. The member of claim 1, wherein the at least one localized structure comprises patterning that penetrates through the flexible material.

6. The member of claim 1, wherein the at least one localized structure is formed to correspond to the features of the second structure.

7. A system comprising:
   a component; and
   heat-rejecting media mechanically and thermally coupled to the component and comprising:
   a flexible material with thickness significantly smaller than that of other dimensions of the flexible material; and
   at least one localized structure patterned within the flexible material prior to mechanically coupling the heat-rejecting media to a second structure, the at least one localized structure having a negative Poisson's ratio such that the heat-rejecting media is configured to conform to features of the component when the heat-rejecting media is mechanically coupled to the component using mechanical stress; and
   a compliant material coupled to the flexible material in order to provide mechanical force to maintain physical contact between the flexible material and the component.

8. The system of claim 7, wherein the flexible material comprises a flexible graphite material.

9. The system of claim 7, wherein the flexible material is thermally conductive and the compliant material is thermally insulative.

10. The system of claim 7, wherein the at least one localized structure comprises patterning that does not penetrate through the flexible material.

11. The system of claim 7, wherein the at least one localized structure comprises patterning that penetrates through the flexible material.

12. The system of claim 7, wherein the at least one localized structure is formed to correspond to the features of the component.

13. A method comprising:
    patterning at least one localized structure within a flexible material having thickness significantly smaller than that of other dimensions of the flexible material, and the at least one localized structure having a negative Poisson's ratio such that a member comprising the flexible material is configured to conform to features of a second structure when the member is mechanically coupled to the second structure using mechanical stress; and
    mechanically coupling a compliant material to the flexible material in order to provide mechanical force to maintain physical contact between the flexible material and the second structure.

14. The method of claim 13, wherein the flexible material comprises a flexible graphite material.

15. The method of claim 13, wherein the flexible material is thermally conductive and the compliant material is thermally insulative.

16. The method of claim 13, wherein the at least one localized structure comprises patterning that does not penetrate through the flexible material.

17. The method of claim 13, wherein the at least one localized structure comprises patterning that penetrates through the flexible material.

18. The method of claim 13, wherein the at least one localized structure is formed to correspond to the features of the second structure.

* * * * *